United States Patent
Baitinger et al.

(10) Patent No.: US 9,846,370 B2
(45) Date of Patent: Dec. 19, 2017

(54) SUPPORT APPARATUS FOR AN OPTICAL DEVICE, OPTICAL DEVICE AND LITHOGRAPHY SYSTEM

(71) Applicant: Carl Zeiss SMT GmbH, Oberkochen (DE)

(72) Inventors: Henner Baitinger, Aalen (DE); Markus Hauf, Ulm (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 15/156,602

(22) Filed: May 17, 2016

(65) Prior Publication Data
US 2016/0259249 A1 Sep. 8, 2016

Related U.S. Application Data

(63) Continuation of application No. PCT/EP2014/072021, filed on Oct. 14, 2014.

(30) Foreign Application Priority Data

Nov. 27, 2013 (DE) .................... 10 2013 224 292

(51) Int. Cl.
 *G03F 7/20* (2006.01)
 *G02B 7/18* (2006.01)
 *G02B 26/08* (2006.01)

(52) U.S. Cl.
 CPC ............ *G03F 7/702* (2013.01); *G02B 7/181* (2013.01); *G02B 26/0816* (2013.01);
(Continued)

(58) Field of Classification Search
None
See application file for complete search history.

(56) References Cited

U.S. PATENT DOCUMENTS

| 6,064,505 A * | 5/2000 | Blanding ................. G02B 7/04 |
| | | 359/224.1 |
| 2002/0017616 A1* | 2/2002 | Ota ..................... G03F 7/70233 |
| | | 250/492.1 |

(Continued)

FOREIGN PATENT DOCUMENTS

| DE | 10 2008 049 556 A1 | 4/2010 |
| DE | 10 2011 088 735 A1 | 6/2012 |
| WO | WO 2010/089526 A2 | 8/2010 |

OTHER PUBLICATIONS

International Search Report, with translation, for corresponding PCT Appl. No. PCT/EP2014/072021, dated Dec. 2, 2014.
(Continued)

*Primary Examiner* — Steven H Whitesell Gordon
(74) *Attorney, Agent, or Firm* — Fish & Richardson P.C.

(57) ABSTRACT

A support device for an optical apparatus is disclosed. The support device includes first and second support elements. The support device also includes first and second flexure bearings. The first flexure bearing and the second flexure bearing each connect the first support element and the second support element to one another in a thermally conductive manner and hold the first support element in a manner movable in at least one first direction relative to the second support element. Spring forces generated by the first flexure bearing and the second flexure bearing partly or completely cancel one another out in the case of a movement of the first support element relative to the second support element in the first direction.

24 Claims, 6 Drawing Sheets

(52) U.S. Cl.
CPC ...... *G03F 7/70075* (2013.01); *G03F 7/70116* (2013.01); *G03F 7/70141* (2013.01); *G03F 7/70825* (2013.01); *G03F 7/70891* (2013.01)

(56) References Cited

U.S. PATENT DOCUMENTS

2011/0181852 A1 7/2011 Bleidistel et al.
2013/0314681 A1 11/2013 Erath et al.

OTHER PUBLICATIONS

J. van Eijk et al., "Plate Spring Mechanism with Constant Negative Stiffness," Mechanism and Machine Theory, vol. 14, No. 1, pp. 1-9, Jan. 1979.

\* cited by examiner

SUPPORT APPARATUS FOR AN OPTICAL DEVICE, OPTICAL DEVICE AND LITHOGRAPHY SYSTEM

CROSS-REFERENCE TO RELATED APPLICATIONS

The present application is a continuation of, and claims benefit under 35 USC 120 to, international application PCT/EP2014/072021, filed Oct. 14, 2014, which claims benefit under 35 USC 119 of German Application No. 10 2013 224 292.1, filed Nov. 27, 2013. The entire disclosure of international application PCT/EP2014/072021 and German Application No. 10 2013 224 292.1 are incorporated by reference herein

FIELD

The disclosure relates to a support device for an optical apparatus, an optical apparatus and a lithography installation.

BACKGROUND

By way of example, lithography installations are used in the production of integrated circuits or ICs for imaging a mask pattern in a mask onto a substrate such as e.g. a silicon wafer. In so doing, a light beam generated by an optical system is directed through the mask onto the substrate.

Driven by the desire for ever smaller structures, particularly in the production of integrated circuits, EUV lithography installations that use light with a wavelength in the range from 5 nm to 30 nm, in particular 13.5 nm, are currently under development. "EUV" denotes "extreme ultraviolet". In the case of such lithography installations, because of the high absorption of light of this wavelength by most materials, reflective optics, that is to say mirrors, have to be used instead of—as previously—refractive optics, that is to say lenses.

The provision of mirrors in the form of so-called mirror fields (also referred to as mirror arrays), which may include several hundred thousand mirrors, is known. Here, the mirrors are each tiltable about one axis or two mutually perpendicularly oriented axes in order to guide the light on a suitable path to the substrate to be exposed. The light incident on a respective mirror causes an influx of heat into the latter. This heat influx can lead to an impairment of, or damage to, the corresponding mirror.

Therefore, US 2011/0181852 A1 has disclosed the practice of connecting a corresponding mirror to a heat sink via thermally conductive elements. Here, the thermally conductive elements do not contribute, or only contribute slightly, to the bearing of the mirror. The thermally conductive elements are embodied as leaf springs. Despite their cross section only being small, an actuator for tilting the corresponding mirror works against the rigidity of the leaf springs. Accordingly, much electrical energy is supplied to the actuator. The power dissipation of the actuator arising in the process is emitted in the form of heat, which needs to be compensated for by corresponding cooling.

SUMMARY

The present disclosure seeks to provide an improved support device for an optical apparatus which, in particular, enables the adjustment of an optical element with a lower expenditure of force and correspondingly lower power dissipation.

In one aspect, the disclosure provides a support device for an optical apparatus, including a first support element and a second support element and a first flexure bearing and a second flexure bearing. The first flexure bearing and the second flexure bearing connect the first support element and the second support element to one another, in each case in a thermally conductive manner. Furthermore, the first flexure bearing and the second flexure bearing hold the first support element in a manner movable in at least one first direction relative to the second support element. Spring forces generated by the first flexure bearing and the second flexure bearing partly or completely cancel one another out in the case of a movement of the first support element relative to the second support element in the first direction.

The force to actuate the optical element is reduced as a result of the spring forces partly or completely canceling one another out. Accordingly, there is also a reduction in the energy consumption of the actuator and the heat loss emitted by the latter. Hence, it is possible, in turn, to use smaller heat sinks. Moreover, it is possible to use smaller actuators. This permits the production of even more compact optical apparatuses and of lithography installations, in particular EUV lithography installations, with such optical apparatuses.

In the present case, a "flexure bearing" should be understood to mean a spring device which allows relative movement between the first support element and the second support element by bending or—more generally—by elastic deformation. That is to say, the elastic deformation of the flexure bearing accompanies the relative movement.

It is also possible for a plurality of first and/or a plurality of second flexure bearings to be provided. In one embodiment, provision is made of two first flexure bearings and one second flexure bearing.

The first support element and the second support element are preferably embodied as a rigid body in each case.

In accordance with one embodiment, the first flexure bearing has a positive spring constant and the second flexure bearing has a negative spring constant. The spring constant c is defined as $$c = \frac{F}{\Delta x},$$

where F is the spring force and $\Delta x$ is the deflection of the spring in the first direction. A "positive" spring constant means that the first flexure bearing tends to press the first support element back into the initial position thereof, while the "negative" spring constant means that the second flexure bearing tends to move the first support element out of the initial position thereof. The initial position corresponds to the position of the first support element in which an actuator for actuating same generates no force. In other words, the initial position corresponds to the rest position of the first support element.

In accordance with a further embodiment, spring elements of the first flexure bearing and/or the second flexure bearing extend in a second direction transverse to the first direction in a non-deflected state of the first support element. What this means is that at least one start and one end of a respective spring element lie on a straight line extending in the second direction. Between the start and end, portions of the spring element can curve e.g. in or counter to the first direction. In the present case, "transverse" means that an angle between the first direction and the second direction is between 90±45°, preferably between 90±30°, more preferably between 90±10° and even more preferably between 90±3°.

In accordance with a further embodiment, the spring elements of the first flexure bearing and/or the second flexure bearing are pretensioned in the second direction. As a result of this, the positive spring constant and/or negative spring constant can be influenced or obtained in a suitable manner.

In accordance with a further embodiment, the spring elements of the first flexure bearing extend in a straight line in the second direction. Additionally or alternatively, the spring elements of the second flexure bearing have a kink pointing in or counter to the first direction. The positive spring constant and negative spring constant can also be adjusted in a suitable manner by this measure.

In accordance with a further embodiment, the spring elements of the first flexure bearing are tensioned and the spring elements of the second flexure bearing are compressed relative to the second support element in a non-deflected state of the first support element. The positive spring constant and negative spring constant can also be adjusted in a suitable manner by this measure.

In accordance with a further embodiment, at least two first flexure bearings and at least one second flexure bearing are provided, wherein the at least one second flexure bearing is arranged between the at least two first flexure bearings. In particular, the flexure bearings are arranged in succession in the first direction such that the following sequence emerges in the first direction: first flexure bearing, second flexure bearing, first flexure bearing.

In accordance with a further embodiment, the first flexure bearing and the second flexure bearing generate a constant force, at least over part of the movement of the first support element relative to the second support element in the first direction. In this embodiment, the first flexure bearing and the second flexure bearing are each embodied as equal-force springs. The spring force generated by the first flexure bearing and the second flexure bearing preferably cancel one another out completely over part of the movement of the first support element relative to the second support element.

In accordance with a further embodiment, at least one portion of the first support element is arranged between a first portion and a second portion of the second support element. The at least one portion of the first support element is supported on the first portion on one side via the first flexure bearing and supported on the second portion on the other side via the second flexure bearing. The first portion and the second portion of the second support element need not necessarily be connected to one another.

Provision can be made of one or more third flexure bearings which guide the movement of the first support element in the first direction. These spring elements, or the spring elements thereof, can extend in a second direction transverse to the first direction.

In accordance with a further embodiment, the spring elements of the first flexure bearing and/or the second flexure bearing extend in the first direction. What this means is that at least one start and one end of a respective spring element lie on a straight line extending in the first direction.

In accordance with a further embodiment, at least two spring elements of the first flexure bearing and/or the second flexure bearing are arranged symmetrically with respect to one another. The axes of symmetry of the first flexure element and the second flexure element can be arranged coaxial to one another.

In accordance with a further embodiment, the spring elements of the first flexure bearing and/or the second flexure bearing have a kink pointing in or counter to a second direction transverse to the first direction. Here, two spring elements of the first flexure bearing and/or the second flexure bearing can be provided with a kink that is symmetrical to one another.

In accordance with a further embodiment, the movement of the first support element relative to the second support element is a linear movement. However, embodiments in which the movement of the first support element relative to the second support element is a rotational movement or a rotational and linear movement are conceivable.

In accordance with a further embodiment, the spring elements of the first flexure bearing and/or the second flexure bearing each have a ratio of the thickness to length and width or of thickness and width to length of at least 1:10. By way of example, the ratio is at least 1:50 or at least 1:100. As a result of the small thickness, such spring elements only have a low second moment of area, which is why a force for actuating the first support element can be provided to be low. In the case of planar spring elements, the thickness is very small in relation to the length and to the width. In the case of rod-shaped elements, both the thickness and the width are very small in relation to the length.

In the case of a further embodiment, the spring elements have a rod-shaped, wire-shaped or film-shaped embodiment. Such spring elements have a low second moment of area.

In accordance with a further embodiment, the spring elements are arranged at a distance from one another. That is to say, a gap, in particular an air gap, is situated between the spring elements. As a result of this measure, it is also possible to provide the same thermal conduction cross section in relation to an integral spring element, wherein, however, the second moment of area $I_{multiplicity}$ is reduced compared to the second moment of area $I_{integral}$ of such an integral spring element when use is made of a multiplicity of spaced apart spring elements. Expressed in equations, the effect consists of the rigidity $c_{integral}$ of an integral spring element being significantly greater than the rigidity $c_{multiplicity}$ of a spring element constructed from a multiplicity n of individual spring elements with the same overall height h:

$$c_{integral} \gg c_{multiplicity}$$

which according to $$c \sim I$$

can be shown by way of the comparison of the second moments of area $$h^3 \sim I_{integral} \gg I_{multiplicity} \sim n\left(\frac{h}{n}\right)^3$$

In accordance with a further embodiment, the first flexure bearing, the second flexure bearing and/or the third flexure bearing are configured to supply the heat influx into the optical element borne via the support device to a heat sink.

In accordance with a further embodiment, the first flexure bearing and/or the second flexure bearing includes a metal, in particular copper, silver and/or gold. As a result, a high conductivity of the flexure bearings is obtained.

Furthermore, an optical apparatus is provided. It includes an optical element and at least one support device as described above. The first support element is coupled to the optical element and the second support element is provided fixed relative to the frame.

Thus, the second support element forms a base. At the same time, the second support element forms a heat sink, to which the heat is guided from the optical element via the first flexure bearing and the second flexure bearing.

Furthermore, provision is made of a lithography installation, in particular an EUV lithography installation, including at least one support device as described above or at least one optical apparatus as described above.

In the present case, "a" does not preclude a multiplicity. Accordingly, the support device, for example, can include a plurality of first and second support elements or a plurality of first and second flexure bearings.

BRIEF DESCRIPTION OF THE DRAWINGS

Further exemplary embodiments are explained in more detail with reference being made to the attached figures in the drawings.

DETAILED DESCRIPTION

Figure 1:
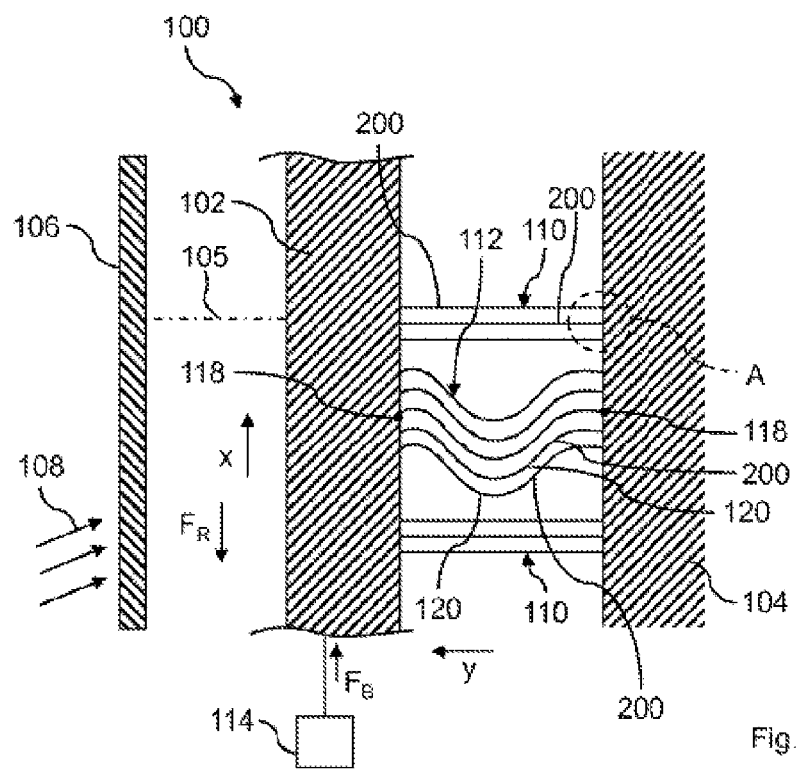
FIG. 1 shows a sectional view of a support device in accordance with an exemplary embodiment.

Unless otherwise indicated, the same reference numerals in the figures designate elements that are the same or functionally the same. It should also be noted that the representations in the figures are not necessarily to scale.

Figure 6:
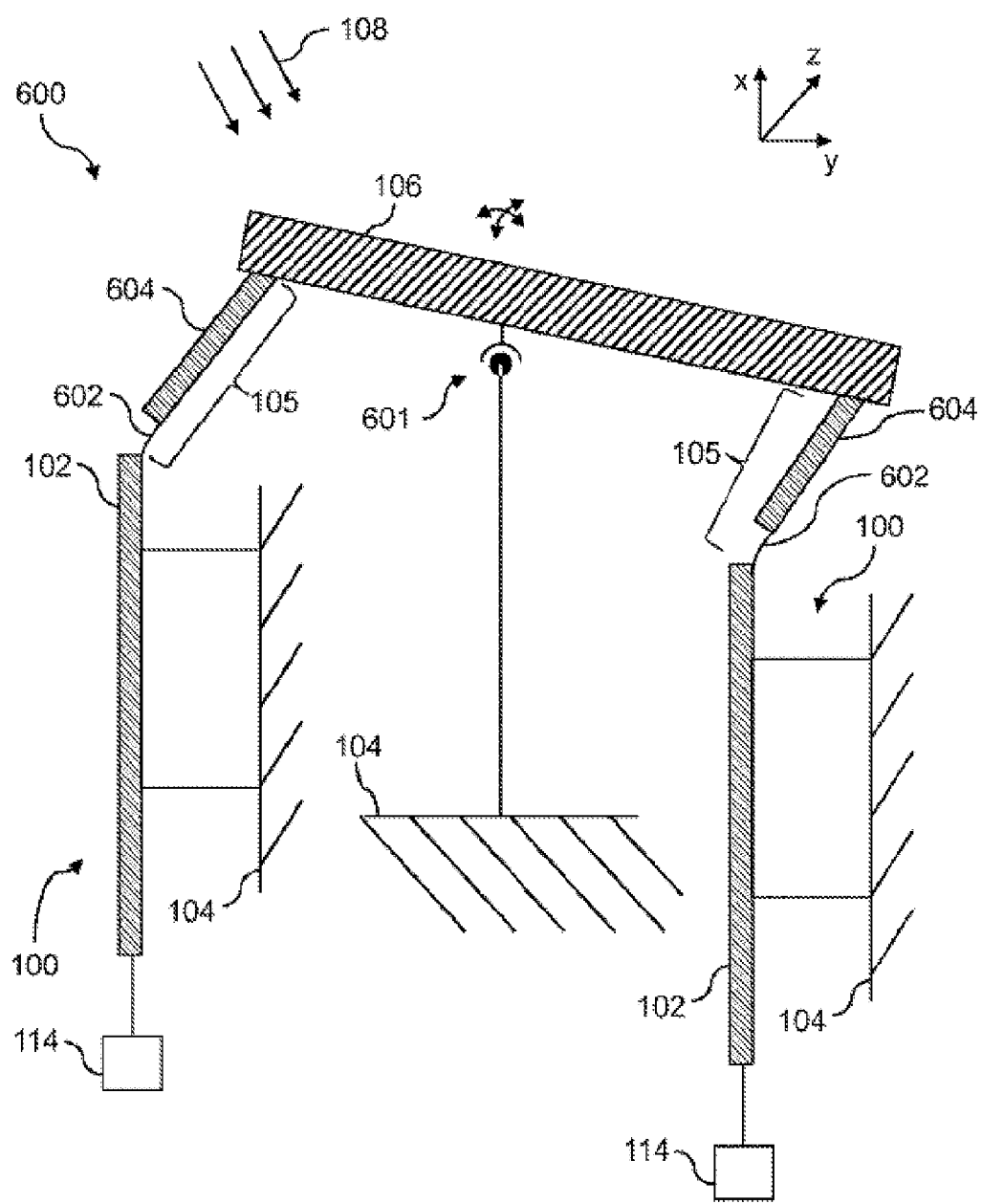
FIG. 6 shows a sectional view of an optical apparatus in a lithography installation in accordance with an exemplary embodiment.

FIG. 1 shows a support device 100 and parts of an optical apparatus 600 shown in FIG. 6. The optical apparatus 600 can be used in an EUV lithography installation 700 shown in FIG. 7.

The support device 100 includes a first support element 102 and a second support element 104. The first support element 102 is provided movable in a first direction x relative to the second support element 104. The second support element 104 is provided fixed relative to the frame and therefore forms a stationary base.

By way of example, the first support element 102 is coupled to an optical element 106 via a mechanism 105 indicated by dashed lines. By way of example, the optical element 106 can be a mirror for reflecting light 108. In a different embodiment, the optical element 106 can be an integral component of the first support element 102.

The support device 100 furthermore includes two first flexure bearings 110 and one second flexure bearing 112. In accordance with the exemplary embodiment, the second flexure bearing 112 is arranged between the first flexure bearings 110, even though other possibilities for the arrangement also exist in this case.

The flexure bearings 110, 112 each connect the first support element 102 to the second support element 104 in a thermally conductive manner. There is a heat influx into the optical element 106 as a result of the light 108 incident on the optical element 106. This heat should be dissipated in order to avoid or reduce damage or thermal deformations of the optical element 106. The heat initially flows via the mechanism 105 into the first support element 102 and, from there, it is guided via the flexure bearings 110, 112 into the second support element 104 acting as a heat sink.

Figure 2:
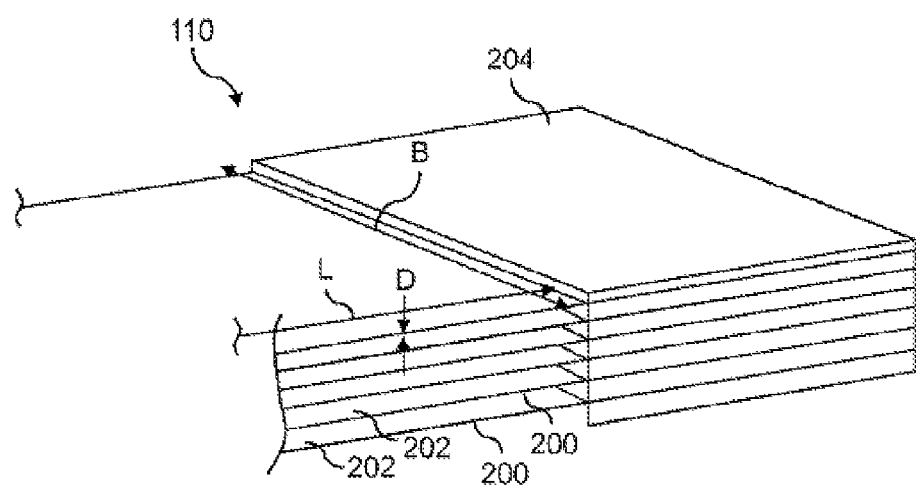
FIG. 2 shows a perspective view of a film stack for use in a support device according to FIG. 1.

In order to obtain a high thermal conductivity of the flexure bearings 110, 112, these can be embodied as a film stack in each case, as is explained in more detail below on the basis of FIG. 2. To this end, FIG. 2 shows a section A from FIG. 1. The section A shows an end of the first flexure bearing 110 which adjoins the second support element 104.

The first flexure bearing 110 has a multiplicity of spring elements 200, each of which have a film-shaped embodiment. That is to say, a thickness D of a respective spring element 200 is very much smaller than the length L and width B thereof. By way of example, the ratio of thickness D to length L and width B can be 1:10 or more. By way of example, such very thin films can be manufactured from steel, silicon, copper, silver or gold, i.e. materials with a high specific thermal conductivity. Due to the only small cross section in the case of a great length, the thermal resistance of an individual spring element 200 nevertheless is high. However, overall, a low thermal resistance emerges for the first flexure bearing 110 as a result of the multiplicity of spring elements 200—e.g. at least 2, at least 10 or at least 20—used in a stack. At the same time, such a stack has a low rigidity, as explained in more detail above.

The spring elements 200 in each case extend in a second direction y perpendicular to the first direction x. The spring elements 200 are arranged parallel to one another, i.e. they are spaced apart perpendicular to the respective planar extent thereof, and therefore in each case form a gap 202 together. By way of example, there is a high vacuum in the gap 202 when the support device 100 is in operation. What the multiplicity of gaps 202 achieves is that the second moment of area and hence the rigidity of the first flexure bearing 110 is significantly lower than in the case of an integrally embodied flexure bearing.

The spring elements 200 can adjoin the second support element 104 by way of a solder joint 204. Here, soldering or brazing in particular comes into question. Alternatively, fastening the spring elements 200 to the second support element 104 can be provided by way of crimping. Accordingly, the opposite end of the flexure bearing 110 can be fastened to the first support element 102 via solder (or crimping).

The explanations made above in respect of FIG. 2 accordingly also apply to the second flexure bearing 112.

An actuator 114 is configured to adjust the first support element 102 in and counter to the first direction x in a manner dependent on a control device (not shown here). The actuator 114 can be embodied as an electromechanical or piezoelectric actuator. For the purposes of adjusting the first support element 102, the actuator 114 applies an actuation force $F_B$ on the support element 102 in the (positive) first direction x. A reaction force $F_R$ acts against the force in the case of an actuation of the support element 102 from the initial position (also referred to as rest position) shown in FIG. 1. This emerges from the sum of the reaction forces of the flexure bearings 110, 112. Below, this is illustrated in an exemplary manner on the basis of FIG. 3, which shows a force-distance graph.

Figure 3:
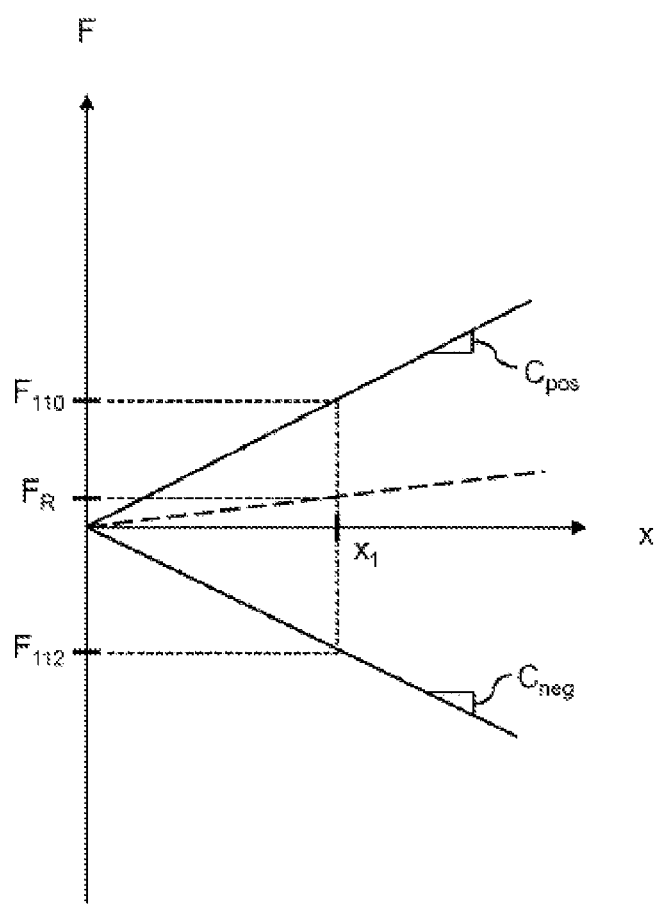
FIG. 3 shows a force-distance graph for the support device from FIG. 1.

The first direction x is plotted on the abscissa in FIG. 3; the force F is plotted on the ordinate. As seen from FIG. 1, the positive direction of the force F is oriented counter to the positive travel x.

In the non-deflected state thereof, the spring elements 200 of the first flexure bearings 110 extend in a straight line in a second direction y perpendicular to the first direction x. The two first flexure bearings 110 carry out the adjustment movement of the first support element 102 and they are provided with a positive spring constant $c_{pos}$. That is to say, the reaction force $F_{110}$ of the first flexure bearings 110 for a position $x_1$ in the positive direction tends to press the first support element 102 back into the initial position. Here, the spring elements 200 act as leaf springs.

By contrast, the second flexure bearing 112 generates a reaction force $F_{112}$ which acts in the negative direction of the force F and to this end has a negative spring constant $c_{neg}$ in the case of an adjustment of the first support element 102 into the position $x_1$. Hence, the second flexure bearing 112 assists the actuation by the actuator 114 in the case of a deflection of the first support element 102 in the positive direction x. The force $F_{112}$ generated by the second flexure bearing 112 acts in the same direction as the actuation force $F_B$.

In order to obtain the negative spring constant $c_{neg}$, the spring elements 200 of the second flexure bearing 112 can in each case lie on a straight line in the second direction y with the opposite ends 118 thereof in the non-deflected state thereof, but have a kink 120 counter to the (positive) first direction x in an intermediate region. The kink 120 emerges by virtue of the second flexure bearing 112 or the spring elements 200 thereof being compressed. Accordingly, the first flexure bearings 110 or the spring elements 200 thereof are tensioned.

As can be furthermore identified in FIG. 3, the forces $F_{110}$ and $F_{112}$ of the flexure bearings 110, 112 partly cancel one another out such that the resultant reaction force $F_R$ in the case of a deflection $x_1$ is less than the force $F_{110}$. In other words, the energy released from the pretension of the second flexure bearing 112 is used to deform the first flexure bearings 110. The actuation force $F_B$ to deform the latter is reduced accordingly.

By way of example, the reaction force $F_R$ can be provided slightly positively such that it tends to return the first support element 102 into the initial position, i.e. it acts in the positive direction.

A support device 100 in accordance with a further exemplary embodiment is illustrated below on the basis of FIG. 4.

The first support element 102 includes a portion 400 which extends between two portions 402, 404 of the second support element 104.

The portion 400 is supported on the portion 402 on one side 406 via the first flexure bearing 110 and supported on the second portion 404 on the other side 408 via the second flexure bearing 112.

In contrast to the exemplary embodiment according to FIG. 1, the springs 200 of the flexure bearings 110, 112 extend in the first direction x such that, in particular, endpoints 118 of a respective spring element 200 lie on a straight line in the first direction x. The flexure bearings 110, 112 can have axes of symmetry 410 coaxial to one another. The spring elements 200 can in each case curve outward away from the axis of symmetry 410 and can have a corresponding kink 412 to this end. Two spring elements 200 can be provided with kinks 412, 412' symmetrical with respect to the axis of symmetry 410.

Figure 4:
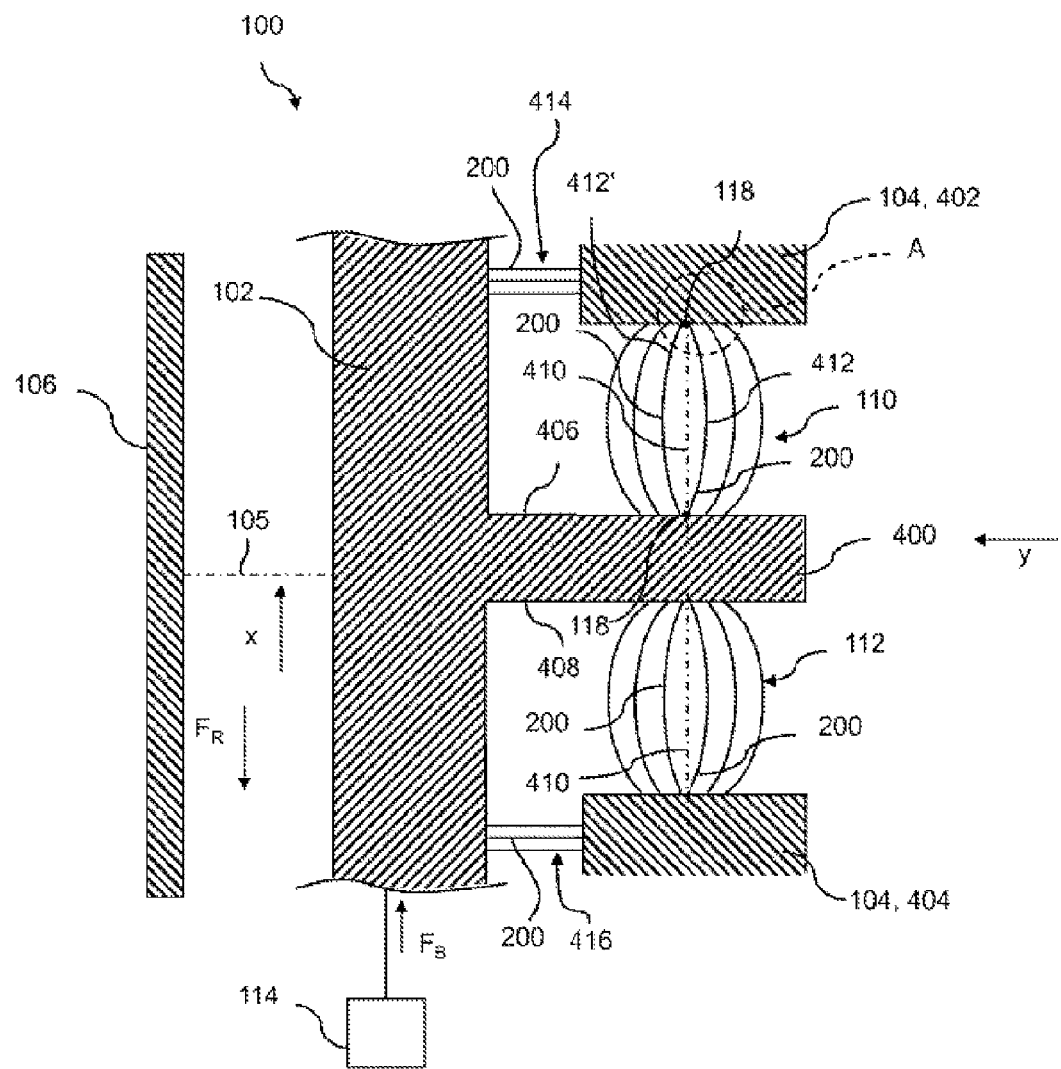
FIG. 4 shows a sectional view of a support device in accordance with a further exemplary embodiment.
Figure 5:
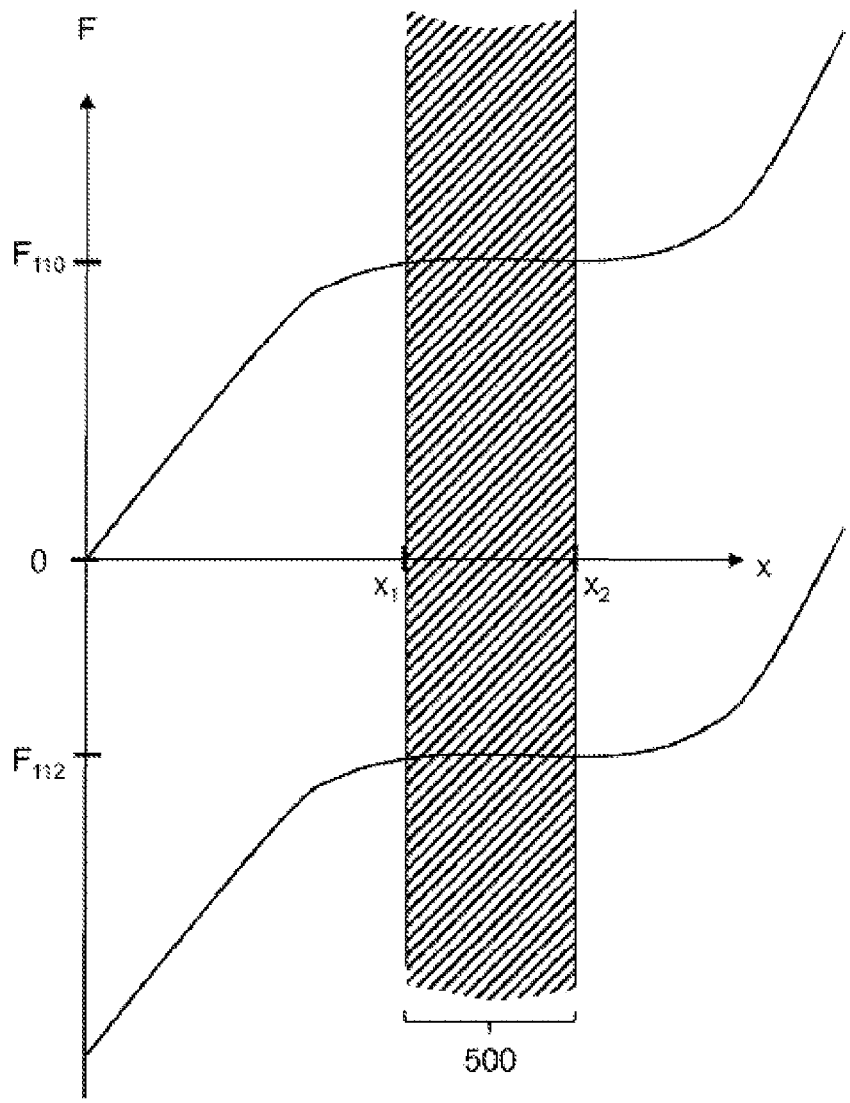
FIG. 5 shows a force-distance graph for the support device from FIG. 4.

In accordance with the exemplary embodiment according to FIG. 4, the flexure bearings 110, 112 are embodied as equal-force springs such that forces generated thereby in reaction to a displacement of the first support element 102 from the initial position thereof via the actuator 114 cancel one another out. This is illustrated below on the basis of FIG. 5.

The reaction force $F_{110}$ generated by the first flexure bearing acts in the positive direction over part 500 of the movement or the travel x between two positions $x_1$ and $x_2$, while the reaction force $F_{112}$ generated by the second flexure bearing 112 acts in the negative direction. Moreover, the forces $F_{110}$ and $F_{112}$ are of equal magnitude and therefore cancel one another out.

Accordingly, no counterforce resulting from the deformation of the flexure bearings 110, 112 acts against the actuation force $F_B$ of the actuator 114 when adjusting the first support element 102 in the first direction x from the initial position thereof. To this end, the initial position is selected as e.g. position $x_1$.

Accordingly, the actuator 114 has a lower power uptake and a lower thermal power dissipation. Also, the actuator 114 can have a smaller design.

Returning to FIG. 4, what is illustrated there is that third flexure bearings 414, 416 can be provided, the flexure bearings guiding the adjustment movement of the first support element 102 relative to the second support element 104. By way of example, the third flexure bearing 414 connects the support element 102 to the portion 402 and the third flexure bearing 416 connects the first support element 102 to the second portion 404. The flexure bearings 414, 416 each include a multiplicity of spring elements 200 which extend in a straight line in the second direction y in the non-deflected state thereof.

Like the flexure bearings 110, 112, the flexure bearings 414, 416 are designed to transport as much heat as possible from the first support element 102 to the second support element 104. The explanations made in conjunction with FIGS. 1 and 2 apply in respect of the spring elements 200 thereof or the film stack formed thereby.

FIG. 6 now shows a possible application of the support devices 100 explained in FIGS. 1 to 5.

In accordance with the exemplary embodiment according to FIG. 6, two of the support devices 100 are used in the optical apparatus 600 in order to swivel an optical element 106. By way of example, the optical device 600 can be a mirror array, with the depicted optical element 106 forming a mirror of this mirror array.

The optical element 106 is mounted relative to the second support element 104 via the bearing 601, which is embodied as a rotary joint in an exemplary manner, in particular as a ball-and-socket joint. Here, a point of rotation lies as close as possible to the optical element 106 or therewithin.

The plurality of portions of the second support element 104 shown in FIG. 6 form a common base of the optical apparatus 600.

The first support elements 102 of a respective support device 100 are connected to the optical element 106 by way of a mechanism 105. A respective mechanism 105 includes a joint 602 and a third support element 604. The joint 602 connects the first support element 102 to the third support element 604 which, in turn, is connected in a hinged manner not shown in any more detail here with the optical element 106. By way of example, the joints 602 are embodied as rotary joints. The joints 602 can be embodied as flexure bearings, in particular with a low thermal resistance. To this end, the joints 602 can include a metal.

A tilting movement of the optical element 106 can be obtained via an actuation of the actuators 114, wherein the linear movements of the first support elements 102 in the first direction x are converted into rotational movement of the optical element 106 about the z-direction. The third support elements 604 can extend obliquely in the xz-plane such that a rotational movement of the optical element 106 about the y-direction is additionally obtained.

Figure 7:
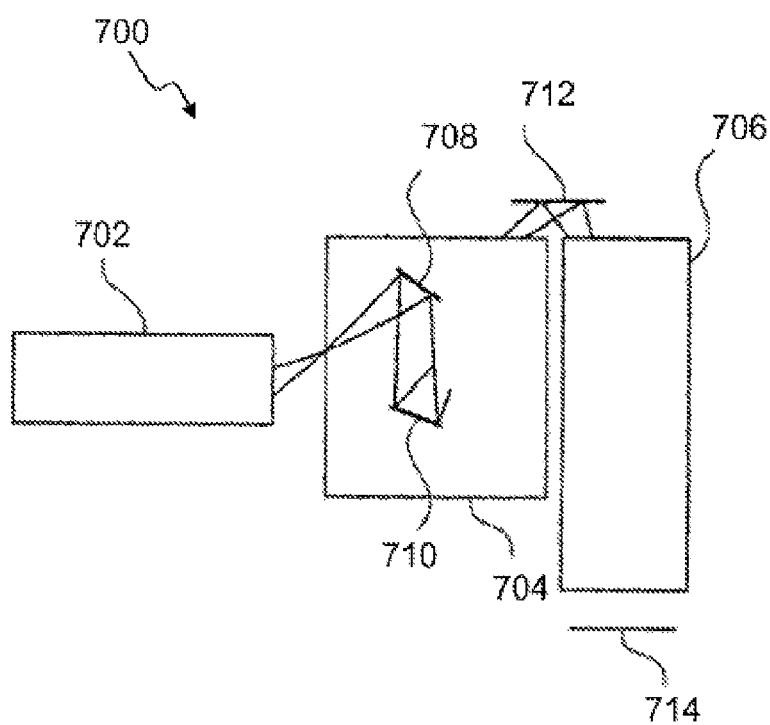
FIG. 7 shows a lithography installation in accordance with one exemplary embodiment.

FIG. 7 shows a lithography installation 700, in particular an EUV lithography installation, in which one or more of the support devices 100 in accordance with FIGS. 1 to 5 or one or more of the optical apparatuses 600 in accordance with FIG. 6 can be applied. Alternatively, the support device 100 and/or the optical apparatus 600 could also find use in other illumination or projection applications.

In accordance with the exemplary embodiment according to FIG. 7, the lithography installation 700 includes a light-forming unit 702, an illumination system 704 and a projection lens 706. The light (working light) from the light-forming unit 702, which is partly depicted in FIG. 7 as a beam path, is guided, e.g. in the illumination system 704, onto mirrors of a mirror field 708, which reflect the light onto mirrors of a mirror field 710. A reticle 712 is illuminated at the end of the illumination system 704. Thereupon, the light is directed onto a substrate 714 in the projection lens 706 such that the structure contained in the reticle 712 is imaged with a reduced size on the substrate 714.

Now, for example, the support device 100 and/or the optical apparatus 600 can find use in the mirror fields 708, 710 in order to mount individual mirrors in a movable, in particular tiltable manner.

Although the disclosure has been described on the basis of various exemplary embodiments, it is not in any way restricted to them but may be modified in a wide variety of ways.

LIST OF REFERENCE SIGNS

100 Support device
102 First support element
104 Second support element
105 Mechanism
106 Optical element
108 Light
110 First flexure bearing
112 Second flexure bearing
114 Actuator
118 End
120 Kink
200 Spring element
202 Gap
204 Solder joint
400 Portion
402 Portion
404 Portion
406 Side
408 Side
410 Axis of symmetry
412 Kink
412' Kink
414 Flexure bearing
416 Flexure bearing
500 Part
600 Optical apparatus
602 Joint
604 Third support element
700 Lithography installation
702 Light-forming unit
704 Illumination system
706 Production lens
708 Mirror field
710 Mirror field
712 Reticle
714 Substrate
B Width
$c_{pos}$ Positive spring constant
$c_{neg}$ Negative spring constant
D Thickness
F Force
$F_B$ Actuation force
$F_R$ Reaction force
$F_{110}$ Reaction force
$F_{112}$ Reaction force
L Length
x First direction
y Second direction
z Third direction

What is claimed is:

1. A support device configured to support an optical element, the support device comprising:
   a first support element;
   a second support element;
   a first flexure bearing; and
   a second flexure bearing,
   wherein:
      the first flexure bearing connects the first and second support elements to each other in a thermally conductive manner;
      the second flexure bearing connects the first and second support elements to each other in a thermally conductive manner;
      the first and second flexure bearings hold the first and second support elements so that the first support element is moveable relative to the second support element in a first direction; and
      the support device is configured so that, when the first support element moves relative to the second support element in the first direction, a spring force generated by the first flexure bearing in a direction opposite to the first direction and a spring force generated by the second flexure bearing along the first direction at least partially cancel each other out.

2. The support device of claim 1, wherein the first flexure bearing has a positive spring constant, and the second flexure bearing has a negative spring constant.

3. The support device of claim 2, wherein:
   the first flexure bearing comprises spring elements extending in a second direction which is transverse to the first direction; and
   the second flexure bearing comprises spring elements extending in the second direction.

4. The support device of claim 3, wherein at least one of the following holds:
   the spring elements the first flexure are pretensioned in the second direction; and
   the spring elements of the second flexure bearing are pretensioned in the second direction.

5. The support device of claim 3, wherein at least one of the following holds:
   in a non-deflected state of the first support element, the spring elements of the first flexure bearing extend in a straight line in the second direction; and the spring elements of the second flexure bearing have a kink pointing in the first direction or in a direction counter to the first direction.

6. The support device of claim 1, wherein:
the first flexure bearing comprises tensioned spring elements; and
in a non-deflected state of the first support element, the second flexure bearing comprises compressed spring elements.

7. The support device of claim 1, further comprising a third flexure bearing, wherein:
the third flexure bearing is between the first and second flexure bearings;
the third flexure bearing connects the first and second support elements to each other in a thermally conductive manner; and
the first, second and second flexure bearing hold the first and second support elements so that the first and second support elements are moveable relative to each other in a first direction.

8. The support device of claim 1, wherein the support device is configured so that, when the first support element moves relative to the second support element in the first direction:
the first flexure bearing generates a constant force during at least part of the movement of the first support element relative to the second support element in the first direction; and
the second flexure bearing generates a constant force during at least part of the movement of the first support element relative to the second support element in the first direction.

9. The support device of claim 8, wherein:
a portion of the first support element is arranged between first and second portions of the second support element;
the first flexure bearing supports a first side of the portion of the first support element on the first portion of the second support element;
the second flexure bearing supports a second side of the portion of the first support element on the second portion of the second support element; and
the first side of the portion of the first support element is opposite the second side of the first support element.

10. The support device of claim 8, wherein at least one of the following holds:
the first flexure bearing comprises spring elements extending in the first direction; and
the second flexure bearing comprises spring elements extending in the first direction.

11. The support device of claim 8, wherein at least one of the following holds:
the first flexure bearing comprises at least two spring elements arranged symmetrically with respect to each other; and
the second flexure bearing comprises at least two spring elements arranged symmetrically with respect to each other.

12. The support device of claim 10, wherein at least one of the following holds:
the spring elements of the first flexure bearing comprise a kink pointing in: a) a second direction which is transverse to the first direction; or b) a direction counter to the second direction; and
the spring elements of the first flexure bearing comprise a kink pointing in: a) the second direction; or b) the direction counter to the second direction.

13. The support device of claim 1, wherein the support device is configured so that movement of the first support element relative to the second support element is a linear movement.

14. The support device of claim 1, wherein at least one of the following holds:
the first flexure bearing comprises spring elements having a ratio of thickness to width of at least 1:10 and a ratio of thickness to length of at least 1:10; and
the second flexure bearing comprises spring elements having a ratio of thickness to width of at least 1:10 and a ratio of thickness to length of at least 1:10.

15. The support device of claim 1, wherein at least one of the following holds:
the first flexure bearing comprises spring elements comprising at least one shape selected from the group consisting of rod-shaped, wire-shaped, and film-shaped embodiment; and
the second flexure bearing comprises spring elements comprising at least one shape selected from the group consisting of rod-shaped, wire-shaped, and film-shaped embodiment.

16. The support device of claim 1, wherein at least one of the following holds:
the first flexure bearing comprises spring elements that are spaced from each other; and
the second flexure bearing comprises spring elements that are spaced from each other.

17. The support device of claim 1, wherein at least one of the following holds:
the first flexure bearing comprises spring elements that are parallel to each other; and
the second flexure bearing comprises spring elements that are parallel to each other.

18. The support device of claim 1, wherein at least one of the following holds:
the first flexure bearing comprises a metal; and
the second flexure bearing comprises a metal.

19. An optical apparatus, comprising:
an optical element; and
a support device configured to hold the optical element, the support device comprising:
a first support element;
a second support element;
a first flexure bearing; and
a second flexure bearing,
wherein:
the first flexure bearing connects the first and second support elements to each other in a thermally conductive manner;
the second flexure bearing connects the first and second support elements to each other in a thermally conductive manner;
the first and second flexure bearings hold the first and second support elements so that the first support element is moveable relative to the second support element in a first direction; and
the support device is configured so that, when the first support element moves relative to the second support element in the first direction, a spring force generated by the first flexure bearing in a direction opposite to the first direction and a spring force generated by the second flexure bearing along the first direction at least partially cancel each other out.

20. The optical apparatus of claim 19, wherein the optical element comprises a mirror.

21. An installation, comprising:
an illumination system; and
a projection lens,
wherein the installation further comprises:
- an optical element; and
- a support device configured to hold the optical element, the support device comprising:
  - a first support element;
  - a second support element;
  - a first flexure bearing; and
  - a second flexure bearing, and wherein:
- the first flexure bearing connects the first and second support elements to each other in a thermally conductive manner;
- the second flexure bearing connects the first and second support elements to each other in a thermally conductive manner;
- the first and second flexure bearings hold the first and second support elements so that the first support element is moveable relative to the second support element in a first direction;
- the support device is configured so that, when the first support element moves relative to the second support element in the first direction, a spring force generated by the first flexure bearing in a direction opposite to the first direction and a spring force generated by the second flexure bearing along the first direction at least partially cancel each other out; and
- the installation is a lithography installation.

22. The installation of claim 21, wherein the installation is an EUV lithography installation.

23. The installation of claim 21, wherein the optical element comprises a mirror.

24. The installation of claim 21, wherein the projection lens comprises the optical element and the support device.

* * * * *

UNITED STATES PATENT AND TRADEMARK OFFICE
CERTIFICATE OF CORRECTION

| | |
|---|---|
| PATENT NO. | : 9,846,370 B2 |
| APPLICATION NO. | : 15/156602 |
| DATED | : December 19, 2017 |
| INVENTOR(S) | : Henner Baitinger and Markus Hauf |

It is certified that error appears in the above-identified patent and that said Letters Patent is hereby corrected as shown below:

In the Specification

Column 1, Line 16 (approx.): After "herein" insert -- . --.

Column 4, Line 49 (approx.): Delete "c~l" and insert -- c~I --, therefor.

Column 8, Lines 24-34: Delete "Returning to FIG. 4, what is illustrated there is that third flexure bearings 414, 416 can be provided, the flexure bearings guiding the adjustment movement of the first support element 102 relative to the second support element 104. By way of example, the third flexure bearing 414 connects the support element 102 to the portion 402 and the third flexure bearing 416 connects the first support element 102 to the second portion 404. The flexure bearings 414, 416 each include a multiplicity of spring elements 200 which extend in a straight line in the second direction y in the non-deflected state thereof." and insert the same on Column 8, Line 23, as the continuation of same paragraph.

In the Claims

Column 11, Line 18 (approx.): In Claim 7, delete "first, second and second flexure bearing" and insert -- first and second flexure bearings --, therefor.

Signed and Sealed this
Eighth Day of May, 2018

Andrei Iancu
*Director of the United States Patent and Trademark Office*